(12) United States Patent
Kawabata

(10) Patent No.: US 8,679,884 B2
(45) Date of Patent: Mar. 25, 2014

(54) METHODS FOR MANUFACTURING SEMICONDUCTOR APPARATUS AND CMOS IMAGE SENSOR

(75) Inventor: Yasuhiro Kawabata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 14 days.

(21) Appl. No.: 13/455,981

(22) Filed: Apr. 25, 2012

(65) Prior Publication Data
US 2012/0282729 A1  Nov. 8, 2012

(30) Foreign Application Priority Data
May 2, 2011 (JP) ................................. 2011-103007

(51) Int. Cl.
*H01L 21/00* (2006.01)

(52) U.S. Cl.
USPC ...... 438/48; 438/196; 438/302; 257/E21.617; 257/E21.053

(58) Field of Classification Search
USPC ........... 438/48, 196, 207, 218, 219, 302, 305, 438/404; 257/E21.617, E21.053
See application file for complete search history.

(56) References Cited

U.S. PATENT DOCUMENTS

| 6,518,625 B1 | 2/2003 | Nishida et al. |
| 6,649,461 B1 * | 11/2003 | Lai et al. ........................ 438/217 |
| 2004/0033667 A1 | 2/2004 | Lee |

FOREIGN PATENT DOCUMENTS

| JP | 5-218409 A | 8/1993 |
| JP | 5-283404 A | 10/1993 |
| JP | 10-308507 A | 11/1998 |
| JP | 11-003937 A | 1/1999 |
| JP | 11-008387 A | 1/1999 |
| JP | 2002-164528 A | 6/2002 |
| JP | 2006-24876 A | 1/2006 |

\* cited by examiner

*Primary Examiner* — Hoai V Pham
(74) *Attorney, Agent, or Firm* — Canon U.S.A., Inc., IP Division

(57) ABSTRACT

A method for manufacturing a semiconductor apparatus includes the first step of forming a silicon oxide film including a main portion on a second portion and a sub portion between a first portion and a silicon nitride film, the second step of forming a first conductivity type impurity region under the silicon oxide film, and the third step of forming a semiconductor element including a second conductivity type impurity region having an opposite conductivity to the first conductivity type impurity region in the first portion. In the second step, angled ion implantation is performed into a region under the sub portion at an implantation angle using the silicon nitride film as a mask.

20 Claims, 7 Drawing Sheets

METHODS FOR MANUFACTURING SEMICONDUCTOR APPARATUS AND CMOS IMAGE SENSOR

BACKGROUND OF THE INVENTION

1. Field of the Invention

The present invention relates to methods for semiconductor apparatuses, and specifically, to a method for forming an element isolation structure having a silicon oxide film.

2. Description of the Related Art

In semiconductor apparatuses, element isolation structures are provided between adjacent semiconductor elements. A known element isolation structure includes a silicon oxide film locally formed by thermal oxidation and an impurity region formed under the silicon oxide film. Japanese Patent Laid-Open No. 5-283404 discloses that a channel stop region is formed by ion implantation for doping through an element isolation film using a nitride film as a mask. Japanese Patent Laid-Open No. 10-308507 discloses that a defective shield region is formed under an element isolation insulating layer. Japanese Patent Laid-Open No. 2002-164528 discloses that after ion implantation for forming a channel stop layer, the implanted ions are diffused to form the channel stop layer covering the bird's beak portion of a selective oxide film while the selective oxide film is formed by thermal oxidation. Japanese Patent Laid-Open No. 5-218409 discloses that a channel cut region is formed under the bird's beak portion by annealing for solid phase diffusion of the impurity introduced in a surface portion of an element isolation silicon oxide film by ion implantation.

If thermal oxidation is performed for forming a selective oxide film after ion implantation for forming a channel stop layer, as disclosed in Japanese Patent Laid-Open No. 2002-164528, the impurity in the channel stop layer may be widely diffused, and noise cannot be sufficiently reduced. If solid phase diffusion of impurity introduced by ion implantation is performed on the surface of an element isolation silicon oxide film, as disclosed in Japanese Patent Laid-Open No. 5-218409, a channel cut region may not be formed reliably, and noise cannot be sufficiently reduced.

SUMMARY OF THE INVENTION

According the present invention provides a method for manufacturing a semiconductor apparatus. The method includes the first step of thermally oxidizing a silicon substrate using as a mask a silicon nitride film disposed so as to cover a first portion of the silicon substrate without covering a second portion adjacent to the first portion, thus forming a silicon oxide film including a main portion on the second portion and a sub portion between the first portion and the silicon nitride film. The method also include the second step of forming a first conductivity type impurity region under the silicon oxide film, and the third step of forming a semiconductor element including a second conductivity type impurity region having an opposite conductivity to the first conductivity type impurity region. The second step includes performing angled ion implantation into a region under the sub portion using the silicon nitride film as a mask.

Accordingly, the first conductivity type first impurity region can be accurately formed. Consequently, noise arising in a semiconductor element including a second conductivity type impurity region can be sufficiently reduced, and thus, such a semiconductor apparatus can be produced.

Further features of the present invention will become apparent from the following description of exemplary embodiments with reference to the attached drawings.

DESCRIPTION OF THE EMBODIMENTS

Figure 1A:
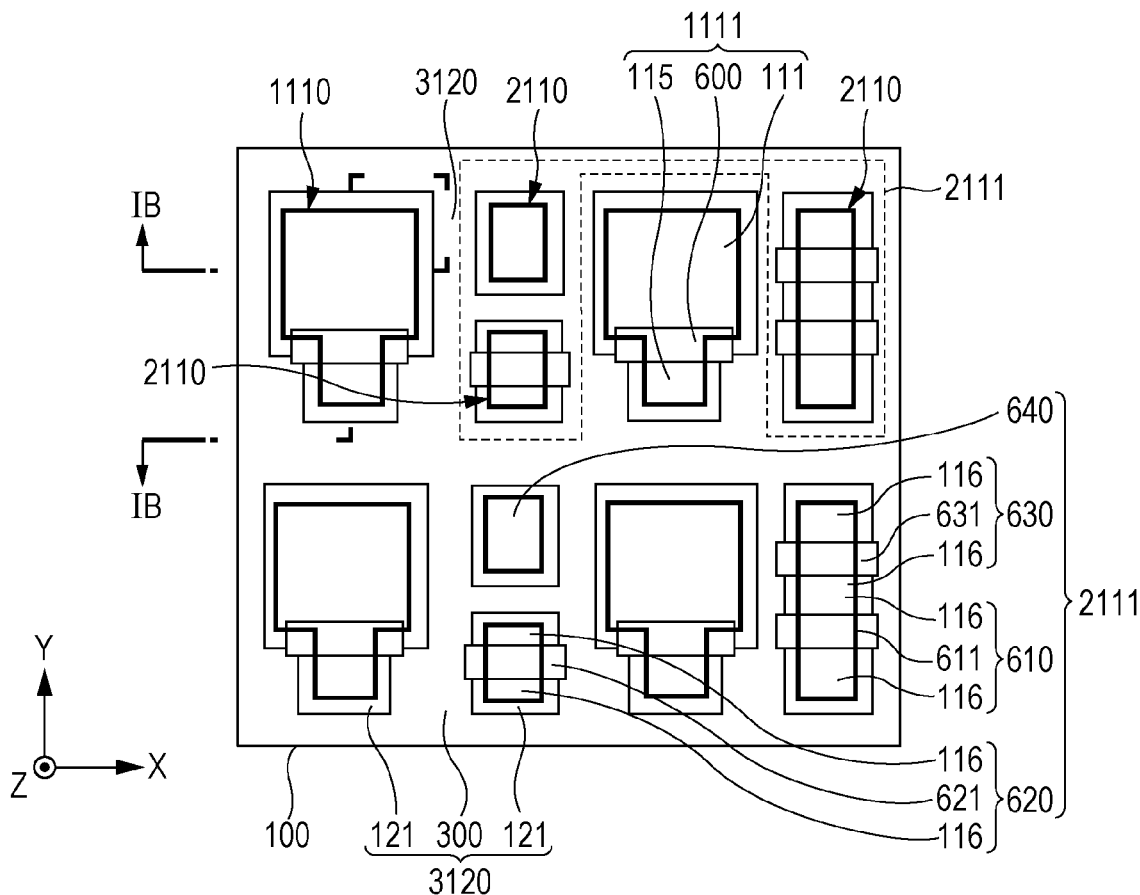
FIG. 1A is a schematic plan view of a semiconductor apparatus according to an embodiment of the invention.
Figure 1B:
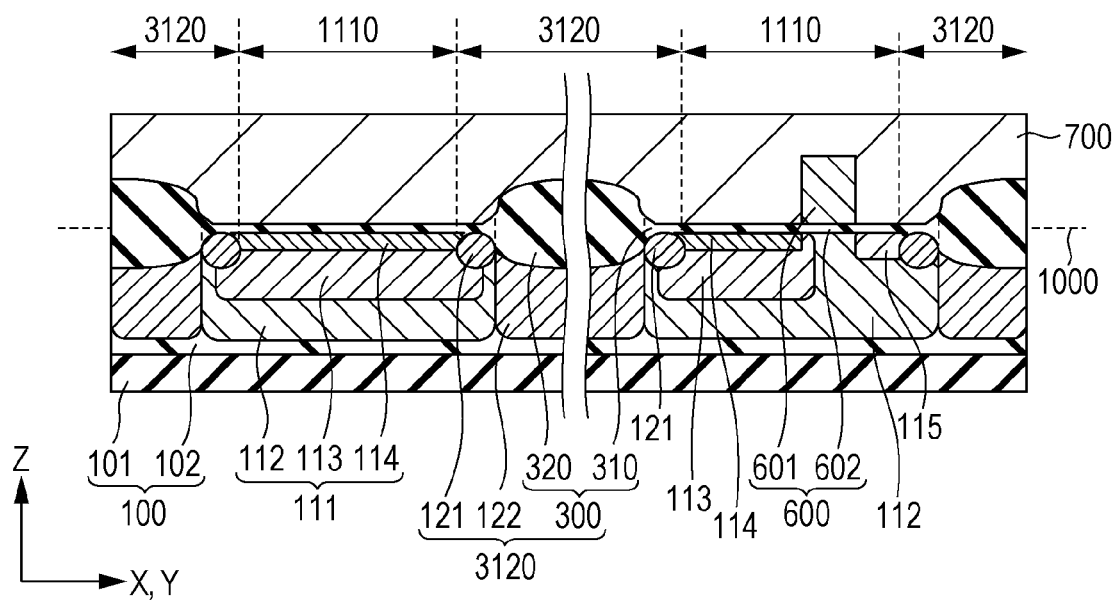
FIG. 1B is a schematic sectional view of the semiconductor apparatus shown in FIG. 1A.

An image sensing apparatus as an example of the semiconductor apparatus, specifically, a CMOS image sensor, will now describe with reference to FIGS. 1A and 1B. FIG. 1A is an X-Y plane view of a semiconductor apparatus, and FIG. 1B is a sectional view of the semiconductor apparatus taken along line IB-IB in FIG. 1A. In the following description, the conductivity of a first type (first conductivity type) is a p type, and the conductivity of a second type (second conductivity type) opposite to the first type is an n type. In contrast, however, the first conductivity type may be an n type and the second conductivity type may be a p type.

FIG. 1A shows four pixels of the image sensing apparatus. Each pixel includes a first semiconductor element group 1111 and a second semiconductor element group 2111. The first semiconductor element group 1111 and the second semiconductor element group 2111 are formed in a silicon substrate 100. Each of the four pixels has the first semiconductor element group 1111, and two pixels share one second semiconductor element group 2111. Hence, the image sensing apparatus has a so-called pixel sharing structure (2-pixel sharing structure). Alternatively, the pixels may have one second semiconductor element group 2111 each, or three or more pixels may share one second semiconductor element group 2111. The number of pixels is not limited to four, and the image sensing apparatus may include as many pixels as, for example, one million or more pixels. The image sensing apparatus may further include a known peripheral circuit formed in a CMOS process.

The first semiconductor element group 1111 is disposed in a first element active portion 1110, and the second semiconductor element group 2111 is disposed in a second element active portion 2110. In FIG. 1A, each of the first element active portions 1110 and second element active portions 2110 is surrounded by a bold line. The second element active portion 2110 of the present embodiment is divided into three areas, but in another embodiment, all semiconductor elements of the second semiconductor element group 2111 may be arranged together in one element active portion.

The first element active portion 1110 is surrounded by an element isolation portion 3120. In other words, the first semiconductor element group 1111 is surrounded by the element isolation portion 3120. The second element active portion 2110 is disposed opposite the first element active portion 1110 with the element isolation portion 3120 therebetween. Also, the second element active portion 2110 is surrounded by the element isolation portion 3120. Hence, the first semiconductor element group 2111 is also surrounded by the element isolation portion 3120.

The element isolation portion 3120 includes a silicon oxide film 300 formed by a LOCOS (local oxidation of silicon) process and an impurity region 121 disposed in the silicon substrate 100. The silicon oxide film 300 has a bird's beak portion 310, and a first impurity region 121 having a conductivity of the first type is disposed under the bird's beak portion 310. In FIG. 1A, the bird's beak portions 310 are omitted and, instead, the positions of the first impurity regions 121 are shown.

The first semiconductor element group 1111 includes a photoelectric conversion element 111, which is a semiconductor element. The photoelectric conversion element 111 in the present embodiment is a photodiode, but it may be a photogate. The first semiconductor element group 1111 also includes a floating diffusion region 115 having a conductivity of the second type. The first semiconductor element group 1111 also includes a switching element, which is a semiconductor element, between the photoelectric conversion element 111 and the floating diffused region 115. The switching element is a transfer gate 600 having a MOS structure. The transfer gate 600 includes a gate electrode 601 and a gate insulating film 602.

The second semiconductor element group 2111 includes an amplification transistor 610, a reset transistor 620, a selection transistor 630 and a well contact 640. These are semiconductor elements. The amplification transistor 610, the reset transistor 620, and the selection transistor 630 are each a MOSFET including a control electrode (gate) and two main electrodes (source and drain) 116. The main electrodes 116 of each transistor are formed as second conductivity type impurity regions formed in a well region (not shown), which is a first conductivity type impurity region. The well regions of the second semiconductor element group 2111 and the well region 112 of the first semiconductor element group (described later) are set to a predetermined potential with the well contact 640.

The floating diffused region 115 is connected to the gate 611 of the amplification transistor 610 through a conducting wire (not shown). The floating diffused region 115 is also connected to the source of the reset transistor 620 through a conducting wire (not shown). A power-supply voltage is supplied to the drain of the reset transistor 620 and the drain of the amplification transistor 610 through conducting wires (not shown). The source of the amplification transistor 610 and the drain of the selection transistor 630 are defined by a common second conductivity type impurity region. A constant current source (not shown) is connected to the source of the selection transistor 630 with a signal line, and the amplification transistor 610 and the constant current source constitute a source follower circuit.

By applying an ON signal to the gate 621 of the reset transistor 620, the floating diffused region 115 is set to a potential based on the power-supply voltage to reset the charge of the floating diffused region 115. By applying an OFF signal to the gate of the reset transistor 620 and the transfer gate 600, the photoelectric conversion element 111 starts to accumulate signal charges. By applying an ON signal to the transfer gate 600, signal charges are transmitted to the floating diffused region 115 to change the potential of the gate 611 of the amplification transistor 610. By applying an ON signal to the gate 631 of the selection transistor 630, a voltage signal according to the signal charge generated in the photoelectric conversion element 111 appears in a signal line. The signal thus extracted is read by a readout circuit (not shown) and is then outputted to the outside from the image sensing apparatus.

The structure of the semiconductor apparatus will now be described in detail with reference to FIG. 1B. The silicon substrate 100 includes a second conductivity type silicon base 101 and a second conductivity type silicon layer 102 formed on the silicon base 101 by epitaxial growth. The element isolation portion 3120 has a structure (element isolation structure) including a silicon oxide film 300 and a first conductivity type first impurity region 121. The silicon oxide film 300 has a midportion 320 that is a main portion and a bird's beak portion 310 that is a sub portion. In addition, the element isolation portion 3120 may have a first conductivity type second impurity region 122. The first impurity region 121 lies under the bird's beak portion 310 that is the end portion of the silicon oxide film 300, and the second impurity region 122 lies under the midportion 320 of the silicon oxide film 300. Although the impurity concentration of the first impurity region 121 can be higher than that of the second impurity region 122, the impurity concentration of the first impurity region 121 may be lower than or equal to that of the second impurity region 122. The impurity concentrations of the first impurity region 121 and the second impurity region 122 may be $1 \times 10^{15}$ to $1 \times 10^{20}$ atoms/cm$^3$. Both the first impurity region 121 and the second impurity region 122 are in contact with the silicon oxide film 300. The second impurity region 122 extends in the silicon substrate 100 more deeply than the first impurity region 121.

The photoelectric conversion element 111 includes a well region 112 that is a first conductivity type impurity region formed in the second conductivity type silicon layer 102, and a storage region 113 that is a second conductivity type impurity region formed in the well region 112. The well region 112 and the storage region 113 form a pn junction. A surface region 114 that is a first conductivity type impurity region is disposed between the storage region 113 and the surface of the silicon substrate 100. The impurity concentration of the well region 112 is lower than the impurity concentration of the second impurity region 122. The impurity concentration of the surface region 114 is higher than the impurity concentration of the well region 112. The photoelectric conversion element 111 thus has an embedded photodiode structure.

In the vicinity of the bird's beak portion 310 of the silicon oxide film 300 formed by a LOCOS process, particularly in the interface between the first portion 110 and the bird's beak portion 310, a mismatched portion in crystal structure is easily formed. Charges produced in the mismatched portion may cause noise (for example, dark current). If the second conductivity type is an n type, the charges causing noise are electrons, and if the second conductivity type is a p type, the charges causing noise are holes. By forming the first conductivity type first impurity region 121 under the bird's beak portion 310, it is suppressed that the charges produced in the mismatched portion move to the second conductivity type storage region 113 of the photoelectric conversion element 111 and are recombined there. Noise thus can be reduced. Also, noise impact can be reduced not only on the photoelectric conversion element 111, but also on the second conductivity type floating diffused region 115 and the second conductivity type impurity regions that are the main electrodes 116 of the transistors of the second semiconductor group 2111.

The CMOS image sensor may include a composite member 700 on the silicon substrate 100. The composite member 700 may include several members having electrical functions, such as a plurality of wiring layers, interlayer insulating layers that isolate these wiring layers, and plugs connecting the wiring layers and the semiconductor elements, as needed. Also, the composite member 700 may include a member having an optical function to appropriately guide incoming light to the photoelectric conversion element 111. Examples of the member having an optical function include a light-shielding film defining the region that can transmit incoming light, a color filter that separates incoming light, a microlens that condenses incoming light, and an antireflection film that prevents reflection of incoming light. The composite member 700 may include a member having a mechanical function, such as a planarizing layer or an interlayer distance defining layer, and a member having a chemical function, such as an anti-diffusion layer that prevents diffusion of metal or a passivation layer. One member may have two or more functions of electrical functions, mechanical functions, optical functions and chemical functions.

The present invention can be applied also to backside illumination CMOS image sensors. In this instance, the light-receiving surface of the photoelectric conversion element 111 is disposed opposite the silicon oxide film 300 (close to the silicon base 101) in the silicon substrate 100. Also, the composite members 700 may be divided so as to be disposed on both surfaces of the silicon substrate 100. The present invention can be applied also to CCD image sensors. In this instance, a charge coupled element is used as a semiconductor element, in addition to the photoelectric conversion element 111.

A method for manufacturing a semiconductor apparatus will now be described using a CMOS image sensor. The method for manufacturing the CMOS image sensor includes Steps <A> to <O> in the following embodiment, and in the method, Steps <D> and <E> are most important in forming the first impurity region 121.

Figure 2A:
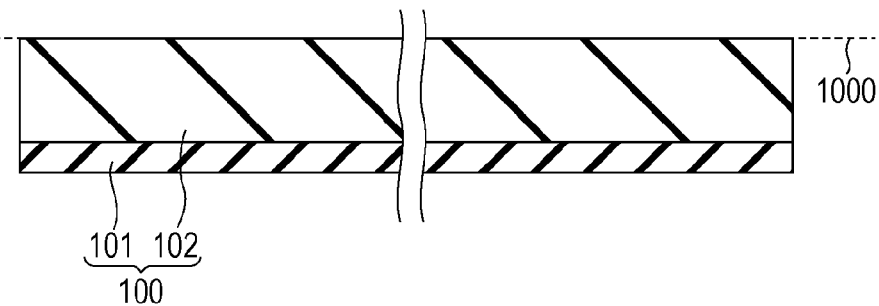
FIGS. 2A to 2D are schematic views showing a method for manufacturing a semiconductor apparatus according to an embodiment of the invention.

Step <A> will be described with reference to FIG. 2A. A second conductivity type silicon layer 102 is formed on a silicon base 101 (silicon wafer) by epitaxial growth. A second conductivity type silicon substrate 100 including the silicon base 101 and the silicon layer 102 is thus prepared. The main surface 1000 of the silicon substrate 100 is the same as the surface of the silicon layer 102 formed in this step. A silicon wafer may be used independently as the silicon substrate 100 without being subjected to epitaxial growth, or the silicon substrate 100 may have SOI (Silicon On Insulator) structure. The second conductivity type silicon layer 102 may be formed by performing ion implantation on a silicon wafer.

Figure 2B:
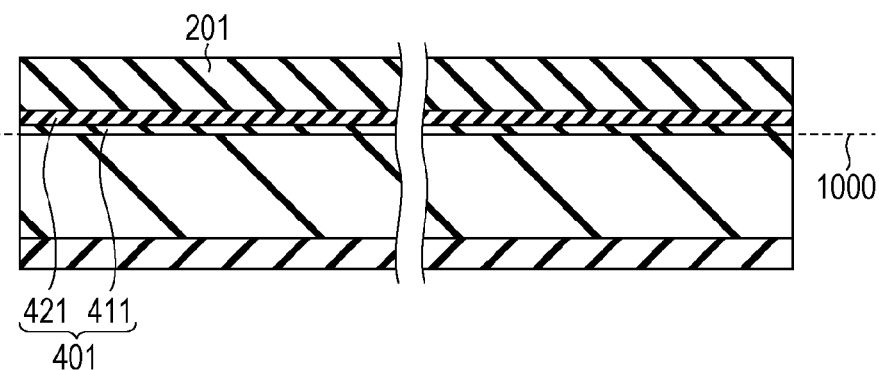

Step <B> will be described with reference to FIG. 2B. The silicon substrate 100 (silicon layer) is heat-treated in an oxidizing atmosphere (thermal oxidation) to form a silicon oxide layer 411 having a thickness of about 10 to 100 nm. Subsequently, a polysilicon layer 421 of about 10 to 100 nm in thickness is formed on the silicon oxide layer 411. Furthermore, a silicon nitride film 201 is formed on the polysilicon layer 421. The thickness of the silicon nitride film 201 can be in the range of 100 to 1000 nm. If the silicon nitride film 201 is formed to a large thickness, stress is increased and may adversely affect subsequent steps. Accordingly, the thickness of the silicon nitride film 201 is desirably 500 nm or less. If the silicon nitride film 201 is formed to a thickness of 500 nm or more, the stress that will arise in the silicon nitride film 201 can be reduced by forming a silicon nitride film 201 having a multilayer structure including a plurality of silicon nitride layers having different densities and thicknesses. For example, a relatively thin first silicon nitride layer is formed by low pressure chemical vapor deposition (LPCVD), and then a second silicon nitride layer is formed to a larger thickness than the first silicon nitride layer on the first silicon nitride layer by plasma chemical vapor deposition.

By providing the silicon oxide layer 411 and the polysilicon layer 421 as an intermediate layer 401 between the silicon nitride film 201 and the silicon substrate 100, the stress between the silicon nitride film 201 and the substrate can be reduced. Although the intermediate layer 401 may consist of only the silicon oxide layer 411, it may be advantageous to form such a multilayer film as the polysilicon layer 421 is disposed between the silicon oxide layer 411 and the silicon nitride film 201.

Figure 2C:
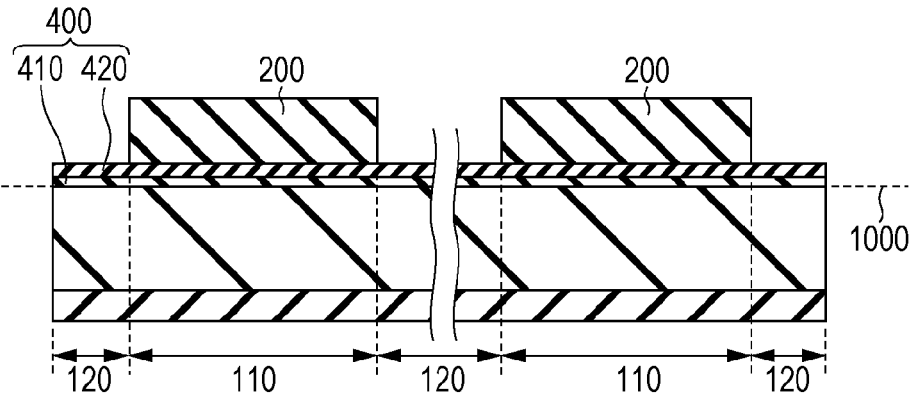

Step <C> will be described with reference to FIG. 2C. A photoresist (not shown) is applied onto the silicon nitride film 201, and is patterned using a photolithography technique (exposure and development). The silicon nitride film 201 is patterned by an etching technique using the patterned photoresist as a mask. The silicon nitride film 201 is thus formed into a patterned silicon nitride film 200.

Consequently, the silicon substrate 100 is distributed into first portions 110 covered with the silicon nitride film 200, and second portions 120 not covered with the silicon nitride film 200 (or intermediate layer 400). In other words, only the first portions 110 of the silicon substrate 100 are covered with the silicon nitride film 200, whereas the second portions 110 of the silicon substrate 100, that is, the portions of the silicon substrate 100 other than the first portions 110, are not covered with the silicon nitride film 200. The second portion 120 adjoins the first portion 110.

The first portion 110 generally corresponds to the first element active portion 1110 of the semiconductor apparatus that will be formed later, and the second portion 120 generally corresponds to the element isolation portions 3120 that will be formed later. Accordingly, the pattern of the photoresist mask and the pattern of the silicon nitride film 200 are appropriately designed according to the layout of the semiconductor elements. The first element active portions 1110 can be surrounded by the element isolation portion 3120, as shown in FIG. 1A. This structure reduces the mixing of noise into the semiconductor elements formed in the element active portions 1110. Accordingly, the silicon nitride film 200 may be patterned so that the second portion 120 surrounds the first portion 110. The patterning of the silicon nitride film 201 and the intermediate layer 401 can be also performed by a liftoff technique without being limited to photolithography and etching.

Figure 2D:
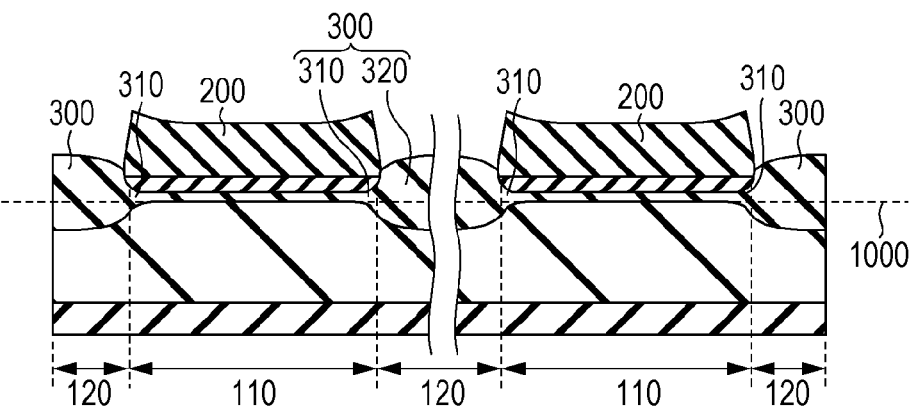

Step <D> will be described with reference to FIG. 2D and FIGS. 7A and 7B. The surface of the silicon substrate 100 is thermally oxidized using the silicon nitride film 200 disposed on the silicon substrate 100 as a mask. Thus a silicon oxide film 300 is formed. This step is performed by so-called LOCOS (Local Oxidation of Silicon). Since the surface of the first portion 110 of the silicon substrate 100 is covered with the silicon nitride film 200 (and intermediate layer 400), the almost entire surface of the first portion 110 are substantially not thermally oxidized. On the other hand, since the surface of the second portion 120 is not covered with the silicon nitride films 200, the substantially entire surface of the second portion 120 is thermally oxidized. Thus, the silicon oxide film 300 locally grows (selectively grows) from the surface of the silicon substrate 100. More specifically, the silicon oxide film 300 grows so as to expand to the upper and lower sides of the main surface 1000 of the silicon substrate 100. The silicon oxide film 300 may include the silicon oxide layer 410 formed as the intermediate layer 400, and the polysilicon layer 420 thermally oxidized in this step.

The edge of the surface of the first portion 110 are also thermally oxidized in this step in spite of the presence of the silicon nitride film 200 covering the first portions 110. The thickness of the silicon oxide portion formed at the edge of the surface of the first portion is not so large as that of the silicon oxide portion formed on the surface of the second portion 120, but is not negligible. Also, the thickness of the silicon oxide portion at the edge of the surface of the first portion 110 decreases gradually in the direction from the second portion 120 to the first portion 110. The silicon oxide portion formed at the edge of the surface of the first portion 110 is customarily called bird's beak portion 310 because of the shape. FIG. 7A is an enlarged view of the bird's beak portion 310 and it vicinity. Although the silicon oxide layer 410 and the polysilicon layer 420 that have been formed in Step <C> have substantially uniform thicknesses, the edge of the intermediate layer 400 can be thermally oxidized and integrated with the silicon oxide film 300 by thermal oxidation performed in this step. When the intermediate layer 400 includes the silicon oxide layer 410, the bird's beak portion 310 can include the edge of the silicon oxide layer 410 between the first portion 110 and the silicon nitride film 200. When the intermediate layer 400 includes the polysilicon layer 420, the bird's beak portion 310 can include the edge of the polysilicon layer 420 thermally oxidized between the first portion 110 and the silicon nitride film 200. Accordingly, the end of the bird's beak portion 310 (opposite the second portion 120) is considered to be the position at which the thickness of the silicon oxide film 300 starts to vary in the direction parallel to the main surface 1000. The origin of the bird's beak portion 310 lies on the extension of the boundary between the first portion 110 and the second portion 120. In this step, the silicon nitride film 200 may be warped and deformed into the state shown in FIGS. 3D and 7A from the state shown in FIG. 3C by the growth of the silicon oxide film 300. However, the displacement, in the direction parallel to the main surface 1000, of the edge of the silicon nitride film 200 (boundary between the first portion 110 and the second portion 120) between Step <C> and Step <D> is very small, and it can be considered that the position of the edge substantially is not displaced. The width W (shortest distance from the origin to the end) of the bird's beak portion 310 is generally about 100 to 300 nm. Also, the midportion 320 of the silicon oxide film 300 generally has a thickness of about 100 to 600 nm. The element isolation structure formed by LOCOS is difficult to miniaturize relative to other element isolation structures such as a shallow trench isolation (STI) structure. The size of the semiconductor apparatus that the invention can be applied to is not particularly limited. However, if the invention is applied to an image sensing apparatus, the use of a silicon substrate 100 having an area of 200 mm$^2$ or more allows the increase in both the number of pixels and the sensitivity easily at a high level in practice.

A part or the entirety of the intermediate layer 400 overlying the second portion 120 may be removed in the foregoing Step <C>. For example, the thickness of the polysilicon layer 420 overlying the second portion 120 may be reduced to be smaller than that in Step <B>, or the polysilicon layer 420 overlying the second portion 120 may be completely removed and, further, the thickness of the silicon oxide layer 410 may be reduced to be smaller than that in Step <B>. Furthermore, the intermediate layer 400 overlying the second portion 120 may be completely removed to expose the second portion 120. However, in order to control the shape of the silicon oxide film 300 more appropriately in Step <D>, at least part of the polysilicon layer 420 and the entire silicon oxide layer 410 can be left on the second portion 120 in step <C>.

In Step <E>, in order to form a first impurity region 121 under the bird's beak portion 310, ion implantation (first ion implantation) is performed on the first portion 110 from the upper side of the second portion 120 using the silicon nitride film 200 as a mask. The first portion 110 mentioned in this Step <E> refers to a part of the first portion 110 described in Step <C>, and a part of the silicon substrate 100 (silicon layer 102) not oxidized in Step <D>. Also, the second portion 120 mentioned in Step <E> refers to a part of the second portion 120 described in Step <C>, and a part of the silicon substrate 100 (silicon layer 102) not oxidized in Step <D>.

Step <E> will be described with reference to FIGS. 3A to 3D and FIGS. 7A and 7B. FIG. 7B shows plan views of the region generally corresponding to the first element active portion 1110, and <1>, <2>, <3> and <4> of FIG. 7B correspond to FIGS. 3A, 3B, 3C and 3D, respectively. As shown in FIG. 1A, the first impurity region 121 can be formed so as to surround the element active portion. However, the first ion implantation performed from a single direction in the plane (X-Y plane) parallel to the main surface 1000 of the silicon substrate 100 can form at most only a half of the surrounding first impurity region 121. Accordingly, the first ion implantation can be performed from a plurality of directions in the plane (X-Y plane) parallel to the main surface 1000 of the silicon substrate 100. In the present embodiment, the first ion implantation is performed in four directions (indicated by arrows D1 to D4).

The angles of the first ion implantation will now be described with reference to FIG. 7A. The angle of the ion irradiation of the silicon substrate 100 for the first ion implantation is not parallel or perpendicular to the main surface 1000 of the silicon substrate 100, as indicated by arrows. Hence, angled ion implantation is performed. The direction of the ion implantation is from the second portion 120 to the first portion 110. The solid arrows of the arrows shown in FIG. 7A indicate the paths of ions that will serve to form the first impurity region 121, and the dashed arrows indicate the paths of ions that will not serve to form the first impurity region 121.

The first ion implantation is performed at an angle in the range θ of 10° to 80°, and the implantation angle θ can be appropriately set according to the shape of the bird's beak portion 310. The implantation angle θ used herein is defined with respect to the direction perpendicular to the main surface 100 of the silicon substrate 100 (with respect to the normal to the main surface 1000). FIG. 7A shows the upper end 3111 (opposite the second portion 120) of the bird's beak portion 310, the upper origin 3121 (adjacent to the midportion 320) of the bird's beak portion 310, the lower end 3112 (adjacent to the first portion 110) of the bird's beak portion 310, and the lower origin 3122 (adjacent to the second portion 120) of the bird's beak portion 310. Dotted line A is an imaginary line connecting the upper end 3111 and the upper origin 3121 of the bird's beak portion 310. Dotted line B is an imaginary line connecting the lower end 3112 and the lower origin 3122 of the bird's beak portion 310, and dotted line B' is an imaginary line that is the normal to the dotted line B, extending through the upper origin 3121 of the bird's beak portion 310.

Dotted line A forms an angle α with the normal to the main surface 1000, and dotted line B' forms an angle β with the normal to the main surface 1000. The implantation angle θ of the first ion implantation can be smaller than or equal to α, and larger than or equal to β. It is desirable to be α>β, and when the implantation angle θ is larger than or equal to β and smaller than or equal to α (β≤θ≤α), the first impurity region 121 can be formed at a desirable position. Since the typical angles α and β are about 60° and about 15°, respectively, the implantation angle θ can be in the range of 15° to 60°. When aq holds true, the implantation angle is set so as to satisfy 0°<θ≤α. However, it is desirable that the silicon oxide film 300 is formed so that the bird's beak portion 310 satisfies β<α.

The first conductivity type first impurity region 121 is formed under the bird's beak portion 310 by the first ion implantation performed at such an angle. The first impurity region 121 can be formed so as to come into contact with the bird's beak portion 310. The portion of the first impurity region 121 having the highest impurity concentration can be located immediately under the bird's beak portion 310. In particular, the first ion implantation can be performed so that the impurity concentration becomes the highest at the interface between the silicon substrate 100 and the silicon oxide film 300, more specifically, at the interface between the first portion 110 and the bird's beak portion 310 or a position slightly away from this interface. More specifically, the implantation energy is set so that such ion implantation can be performed. In this instance, the first impurity region 121 has an impurity concentration profile in which the impurity concentration decreases as the distance from the bird's beak portion 310 is increased. The first ion implantation energy is appropriately set so that the impurity concentration and position of the first impurity region 121 can be as above. More specifically, it can be set in the range of 10 to 200 keV, considerably depending on the thicknesses of the silicon nitride film 200 and the silicon oxide film 300 and the ion implantation angle θ. The dose of the first ion implantation can be in the range of $1 \times 10^{12}$ to $1 \times 10^{14}$ ions/cm$^2$.

Figure 7A:
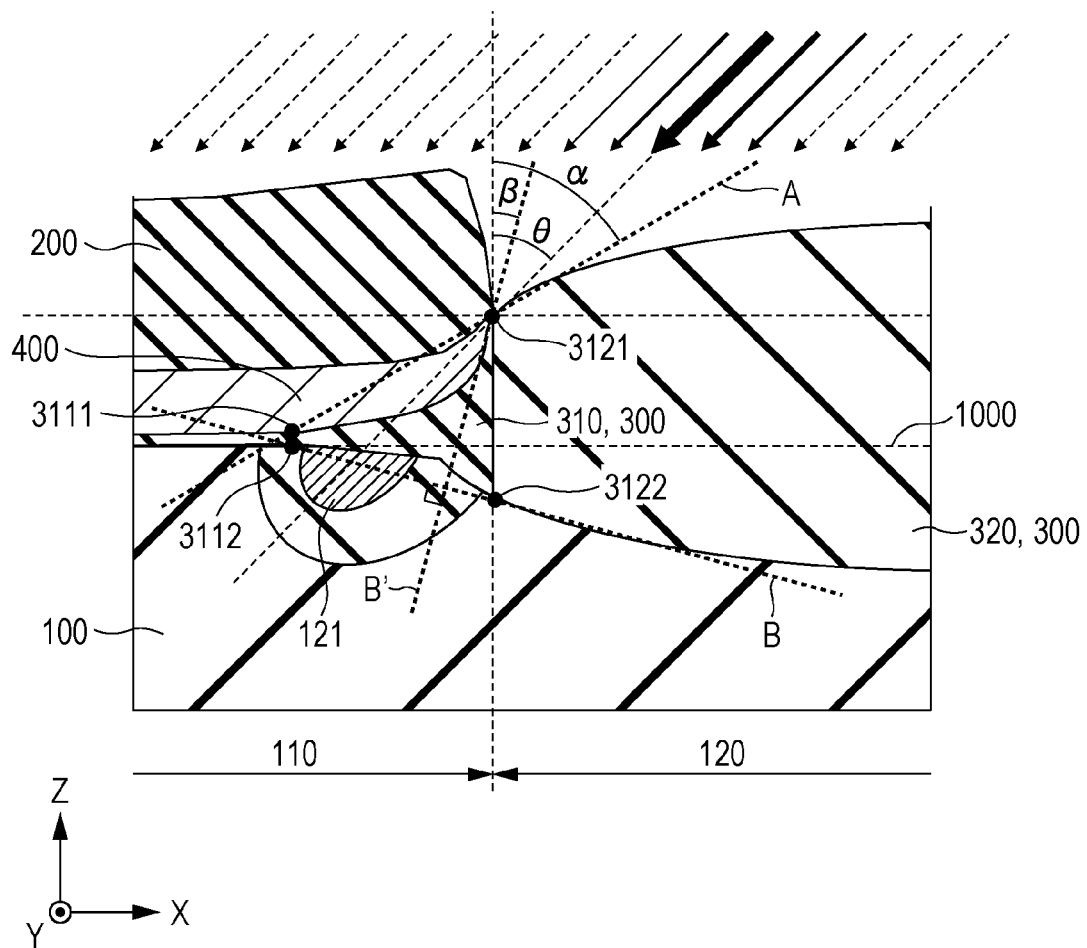
FIGS. 7A and 7B are schematic views showing the manufacturing method of the semiconductor apparatus.

By appropriately setting the implantation angle θ and the implantation energy, irradiated ions whose paths indicated by dotted arrows, which are most part of the irradiated ions indicated by arrows in FIG. 7A, are blocked by the silicon nitride film 200 and the silicon oxide film 300, and are thus hardly implanted into the substrate. On the other hand, the ions indicated by the solid arrows pass through the silicon nitride film 200 and/or the silicon oxide film 300 and are thus implanted into the silicon substrate 100 (silicon layer 102). Typically, ions irradiating the midportion 320 of the silicon oxide film 300 of the irradiated ions are blocked by the midportion 320 and are thus hardly implanted into the second portion 120. Ions irradiating the bird's beak portion 310 pass through the bird's beak portion 310 thinner than the midportion 320, and are thus implanted into the first portion 110. The paths of ions entering the first portion 110 through the position near the upper origin 3121 of the bird's beak portion 310 are indicated by the thicker arrows. Probably, the ions implanted along the paths of the thicker arrows so as to pass through the upper origin 3121 of the bird's beak portion 310 form a core (portion having the highest impurity concentration, darkest portion) of the first impurity region 121.

If the implantation energy is low while the implantation angle θ is 0°, ions irradiated toward the bird's beak portion 310 are blocked by the silicon nitride film 200 and are not implanted under the bird's beak portion 310. On the other hand, if the implantation energy is so high as ions can be implanted under the bird's beak portion 310, most of the emitted ions pass through the silicon nitride film 200, and consequently, the silicon nitride film 200 cannot function as a mask. Thus, ions are likely to be implanted not only under the bird's beak portion 310, but also into almost the entirety of the first portion 110. If ion implantation, but not angled ion implantation, is performed in this manner, it can be impossible or significantly difficult to form the first impurity region 121 at a desired position.

The bird's beak portion 310 of the silicon oxide film 300 formed by LOCOS in Step <D> lies around the boundary between the first portion 110 and the second portion 120. It is however difficult to form a mask precisely aligned with the region where the bird's beak portion 310 has been formed, separately after the formation of the silicon oxide film 300. In addition, since the shape of the surface becomes complicated by the growth of the silicon oxide film 300, the shape of the separately formed mask becomes unstable, and the mask may not satisfactorily function. On the other hand, in this Step <E>, the mask used for the growth of the silicon oxide film 300 is used as the mask for the first ion implantation. Accordingly the first impurity region 121 can be formed in an appropriate position in self-aligned manner. Also, the first impurity region 121 can be formed directly under the bird's beak portion 310. Accordingly, the first impurity region 121 whose position and impurity concentration are appropriately controlled can be formed precisely. As a result, noise that may be produced in the photoelectric conversion element 111, which will be described later, can be sufficiently reduced.

FIGS. 3A to 3D show the step of the first ion implantation performed from four directions. Arrows D1 shown in FIG. 3A and <1> of FIG. 7B indicate a first direction of the first ion implantation in the plane (X-Y plane) parallel to the main surface of the silicon substrate 100. The first direction is substantially from the +X (φ=0°) side to the −X (φ=180°) side. In this instance, the first impurity region 121 is formed in the position shown in FIG. 3A.

Figure 3A:
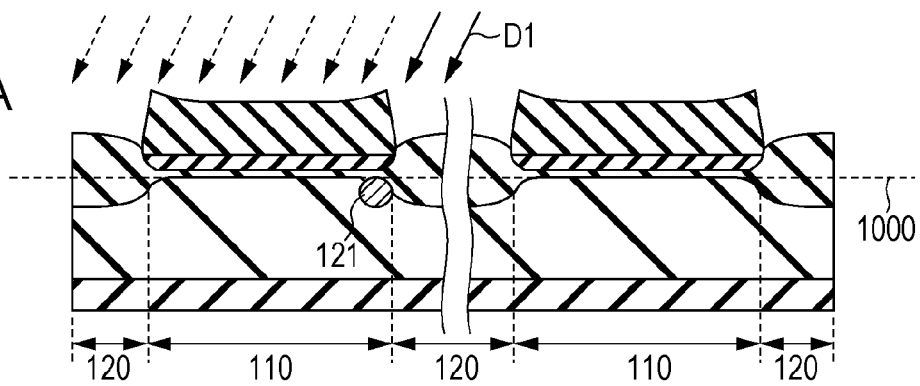
FIGS. 3A to 3D are schematic views showing the manufacturing method of the semiconductor apparatus.
Figure 3B:
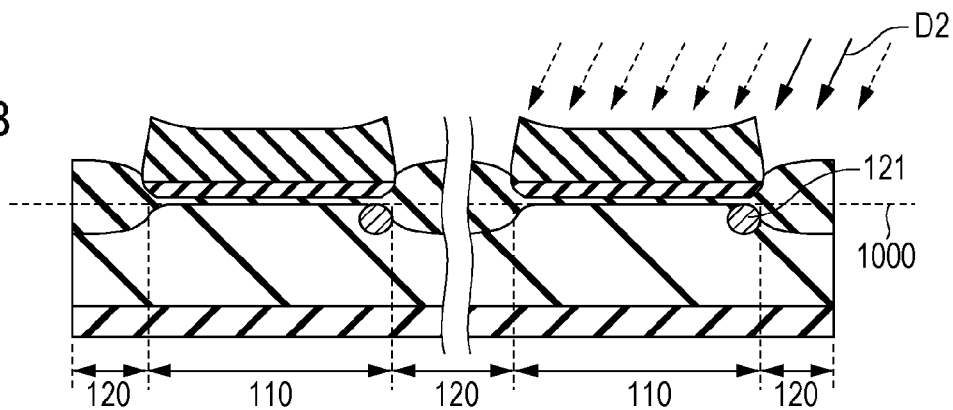
Figure 7B:
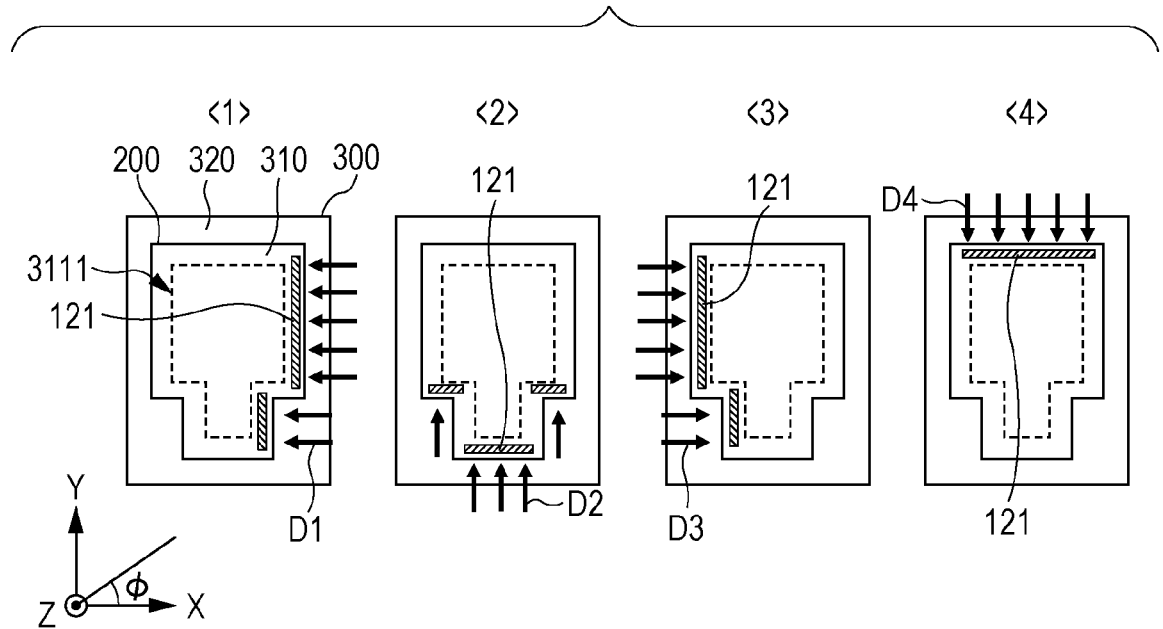

Arrows D2 shown in FIG. 3B and <2> of FIG. 7B indicate a second direction of the first ion implantation in the plane (X-Y plane) parallel to the main surface of the silicon substrate 100. The second direction is substantially from the −Y (φ=270°) side to the +Y (φ=90°) side. In this instance, the first impurity region 121 is further formed as shown in FIG. 3B.

Figure 3C:
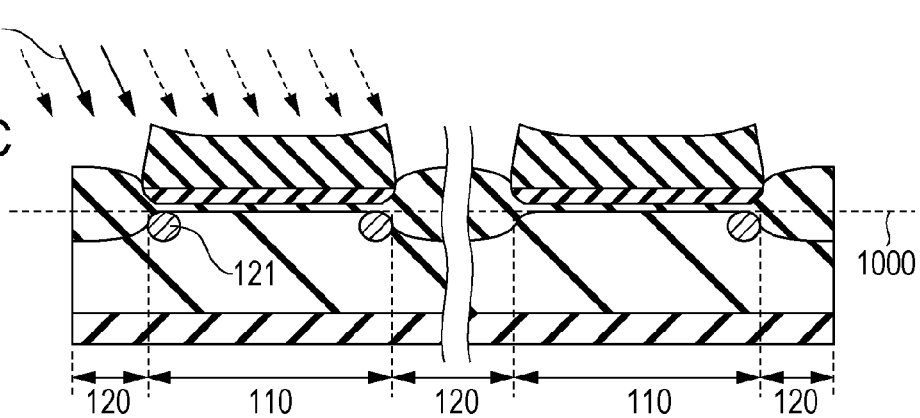

Arrows D3 shown in FIG. 3C and <3> of FIG. 7B indicate a third direction of the first ion implantation in the plane (X-Y plane) parallel to the main surface of the silicon substrate 100. The third direction is substantially from the −X (φ=180°) side to the +X (φ=0°) side, that is, the direction opposite to the first direction. In this instance, the first impurity region 121 is further formed as shown in FIG. 3C.

Figure 3D:
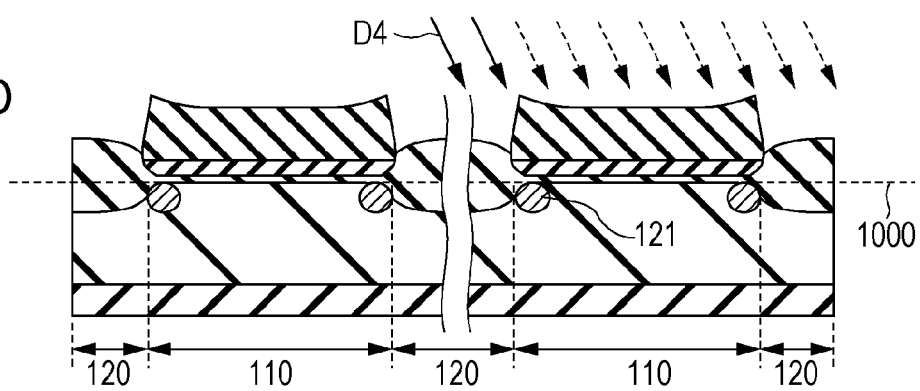

Arrows D4 shown in FIG. 3D and <4> of FIG. 7B indicate a fourth direction of the first ion implantation in the plane (X-Y plane) parallel to the main surface of the silicon substrate 100. The fourth direction is substantially from the +Y (φ=90°) side to the −Y (φ=270°) side, that is, the direction opposite to the second direction. By these operations of ion implantation performed in the four directions, the first impurity region 121 is formed in a surrounding manner. In other words, the portions of the first impurity region formed in the different directions are joined with each other to form a continuous first impurity region 121.

The operations shown in FIGS. 3A to 3D, that is, the operations in the four directions for ion implantation, can be performed any order without particular limitation. Each operation of the first implantation can be performed under the same conditions, including the implantation angle θ. In FIG. 7B, only the paths of ions serving to form the first impurity region 121 are indicated by solid arrows (D1 to D4), and paths of ions not serving to form the first impurity region 121 indicated by dashed arrows in FIGS. 3A to 3D and 7A are omitted.

Thus, the first impurity region 121 can be formed by performing angled ion implantation from a plurality of directions perpendicular to the directions in which the bird's beak portion 310 runs. The step of forming the first impurity region 121 in the vicinity of the region substantially corresponding to the first element active portion 1110 has been described. This step can simultaneously form the first impurity region in the vicinity of the region substantially corresponding to the second element active portion 2110. However, the first impurity region 121 is not necessarily formed for all the element active portions. For element active portions that do not need the first impurity region, such regions may be covered with a mask so that the first impurity region 121 will not be formed under the bird's beak portion 310.

Figure 4A:
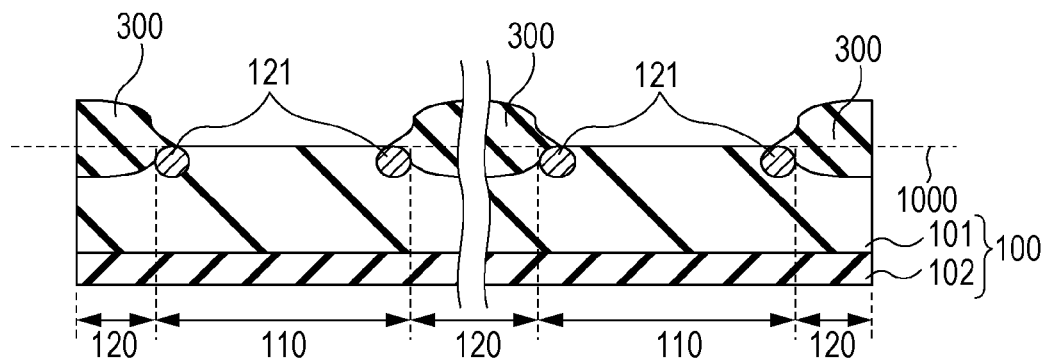
FIGS. 4A and 4B are schematic views showing the manufacturing method of the semiconductor apparatus.

Step <F> will be described with reference to FIG. 4A. The silicon nitride film 200 and the polysilicon layer 420 are removed. The silicon nitride film 200 can be removed by wet etching using phosphoric acid ($H_3PO_4$). The polysilicon layer 420 can be removed by dry etching or wet etching. Then, the silicon oxide layer 410 remaining on the first portion 110 is removed to expose the surface of the first portion 110. The silicon oxide layer 410 can be removed by wet etching using hydrofluoric acid (HF). Part of the surface of the silicon oxide film 300 is also slightly removed by the wet etching of the silicon oxide layer 410. In order to prevent the entire silicon oxide film 300 from being removed, etching time is appropriately controlled.

Figure 4B:
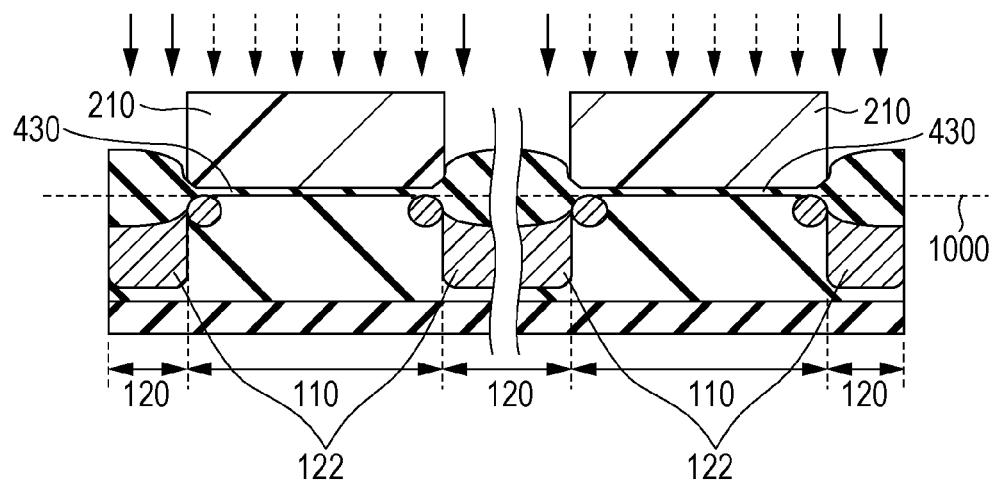

Step <G> will be described with reference to FIG. 4B. The surface of the first portion 110 is oxidized to form a thin silicon oxide buffer film 430, and a first resist film 210 is formed of a photosensitive resin on the buffer film 430. The buffer film 430 may be formed by dry oxidation or wet oxidation. The resist layer 210 is patterned by photolithography so as to cover the first portion 110 without covering the second portion 120. The second portion 120 is subjected to ion implantation (second ion implantation) from the upper side of the second portion using the first resist layer 210 as a mask. Thus, the second impurity region 122 is formed. The dose of the second ion implantation can be in the range of $1\times10^{12}$ to $1\times10^{14}$ ions/cm$^2$. The second impurity region 122 is formed so as to lie in the silicon substrate 100 more deeply than the first impurity region 121. Typically, the implantation angle of the second ion implantation is smaller than that of the first ion implantation. The implantation angle θ of the second ion implantation can be smaller than or equal to 15°, such as 0°.

Figure 5A:
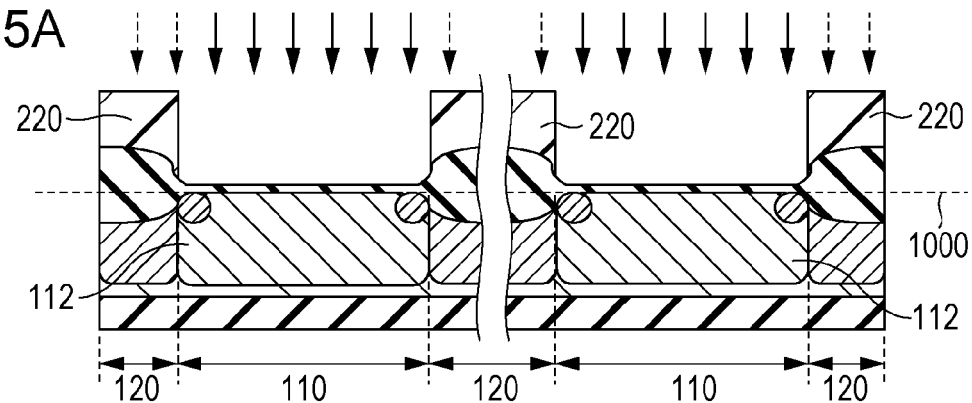
FIGS. 5A to 5D are schematic views showing the manufacturing method of the semiconductor apparatus.

Step <H> will be described with reference to FIG. 5A. After removing the first resist layer 210, a second resist layer 220 is formed of a photosensitive resin on the silicon substrate 100. The second resist layer 210 is patterned by photolithography so as to cover the second portion 120 without covering the first portion 110. The first portion 110 is subjected to ion implantation (third ion implantation) from above using the second resist layer 220 as a mask. Thus, the first conductivity type well region 112 is formed. This ion implantation is performed so that the impurity concentration in the well region 112 is lower than the impurity concentrations in the first impurity region 121 and the second impurity region 122.

Figure 5B:
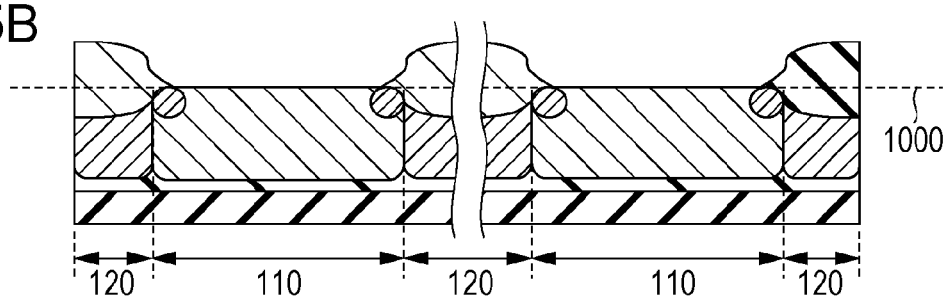

Step <I> will be described with reference to FIG. 5B. The second resist layer 220 and the buffer film 430 are removed to expose the first portion 110.

Figure 5C:
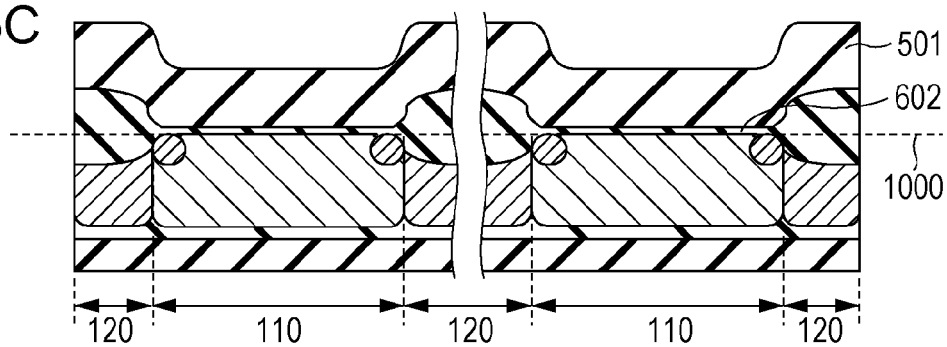

Step <J> will be described with reference to FIG. 5C. A gate insulating film 602 made of silicon oxide is formed on the first portion 110 by dry oxidation such as thermal oxidation or wet oxidation such as ISSG (In Situ Steam Generation). Furthermore, a polysilicon film 501 is formed over the gate insulating film 602 overlying the first portion 110. The polysilicon film 501 lies over the silicon oxide films 300 overlying the second portion 120.

Figure 5D:
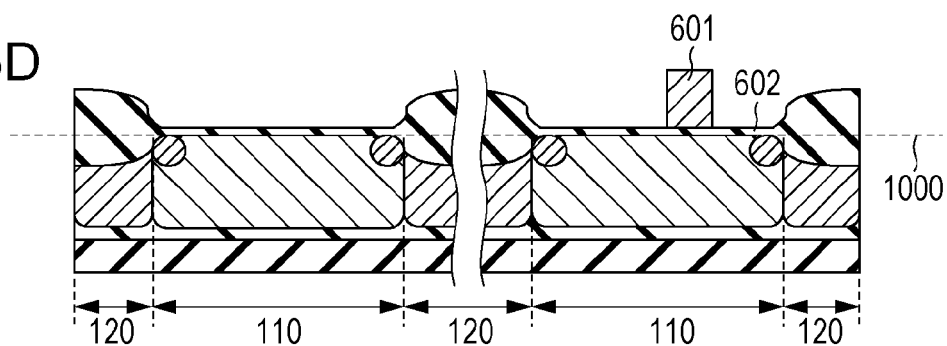

Step <K> will be described with reference to FIG. 5D. A photoresist (not shown) is applied onto the polysilicon film 501, and is patterned using a photolithography technique (exposure and development). The polysilicon film 501 is patterned by an etching technique using the patterned photoresist as a mask. The polysilicon film 501 is patterned into a shape corresponding to the shape of the transfer gate 600, and a gate electrode 601 of the transfer gate 600 is thus formed. In this step, the gates 611, 621, and 631 of the second semiconductor element group 2111 can also be formed simultaneously (not shown).

Figure 6A:
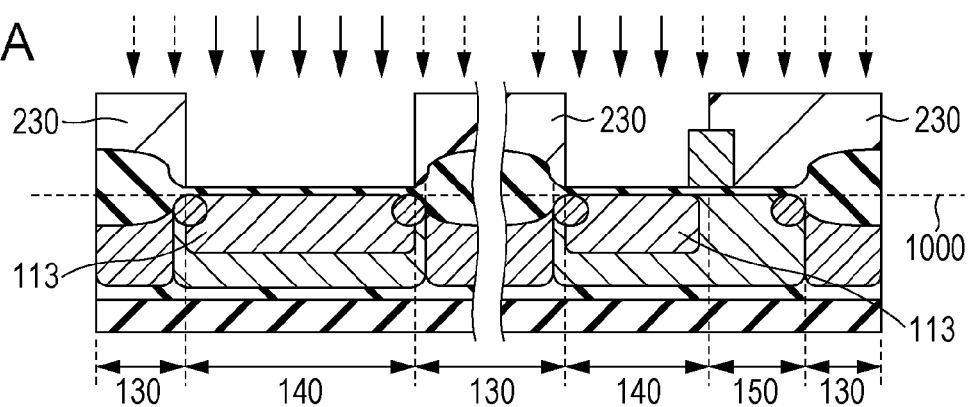
FIGS. 6A to 6D are schematic view showing the manufacturing method of the semiconductor apparatus.

Step <L> will be described with reference to FIG. 6A. A third resist layer 230 is formed of a photosensitive resin on the silicon substrate 100. The third resist layer 230 covers a third portion 130 including the end of the first portion 110 and the second portion 120, and a fifth portion 150 that is a part of the first portion 110. The third resist layer 230 is patterned by photolithography so as not to cover a fourth portion 140 that is a major part of the first portion 110. The third portion 130 includes the end of the first portion 110, and the end of the third portion 130 corresponds to the end of the first portion 110. In other words, the third portion 130 includes the second portion 120 and extends from the second portion 120 to the first portion 110. The fourth portion 140 is subjected to ion implantation (fourth ion implantation) from above using the third resist layer 230 as a mask. Thus, the second conductivity type storage region 113 is formed. By covering the end of the third portion 130 with the third resist layer 230, the storage region 113 is formed so as to be separated from the second impurity region 122 by the well region 112.

Figure 6B:
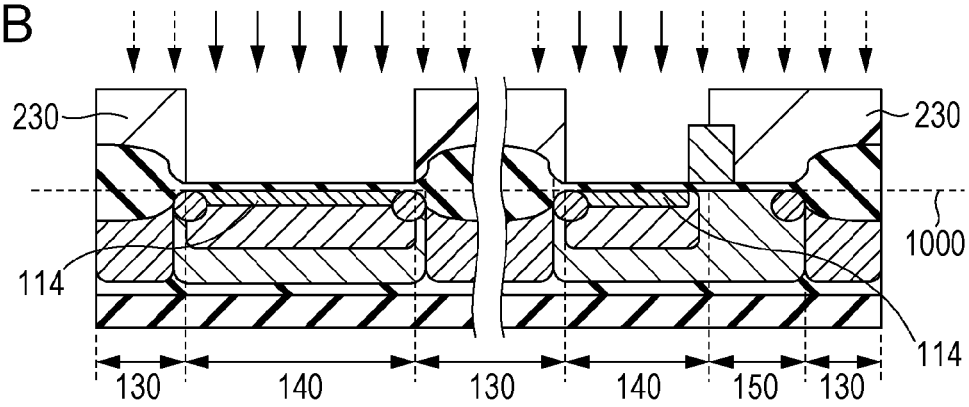

Step <M> will be described with reference to FIG. 6B. Subsequently, the fourth portion 140 is subjected to ion implantation (fifth ion implantation) from above using the third resist layer 230 as a mask. Thus, a first conductivity type surface region 114 is formed. An embedded photodiode is thus formed as a photoelectric conversion element 111 of the first semiconductor element group. In this step, the fifth ion implantation may be performed on the fourth portion 140 from the upper side of the gate electrode 601 by angled ion implantation.

Figure 6C:
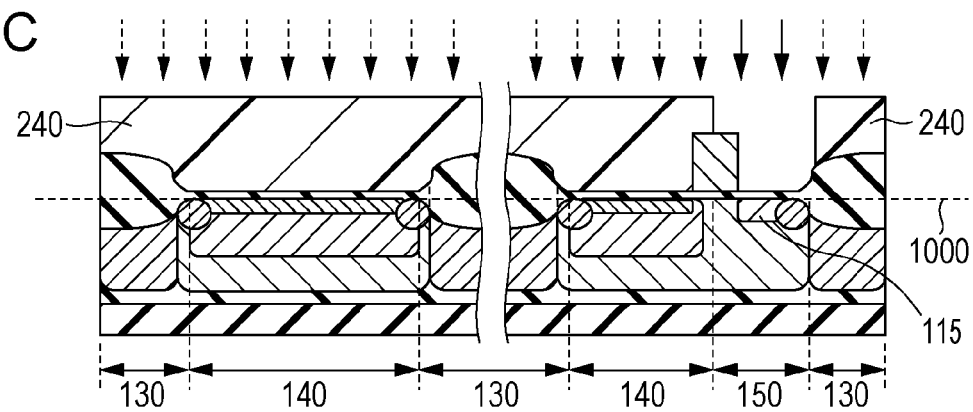

Step <N> will be described with reference to FIG. 6C. After removing the third resist layer 230, a fourth resist layer 240 is formed of a photosensitive resin on the silicon substrate 100. The fourth resist layer 240 is patterned by photolithography so as to cover the third and fourth portions 130 and 140 without covering the fifth portion 150. The fifth portion 150 is subjected to ion implantation (sixth ion implantation) from above. Thus, a first conductivity type floating diffused region 115 is formed as a capacitor element of the first semiconductor element group 1111. In this step, the impurity region forming the main electrode 611 of the second semiconductor element group 2111 can also be formed simultaneously.

Figure 6D:
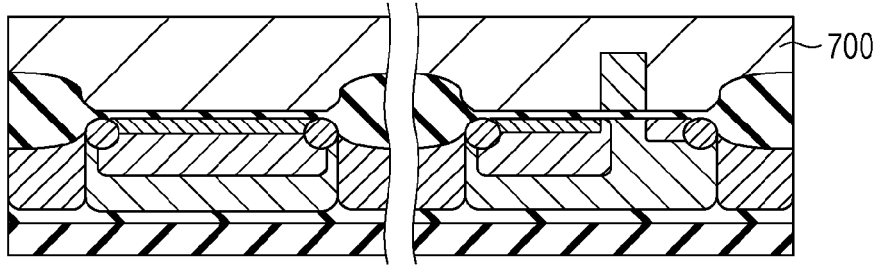

Step <O> will be described with reference to FIG. 6D. The fourth resist layer 240 is removed, and a composite member 700 is formed on the silicon substrate 100. The composite member 700 includes an interlayer insulating layer and a wiring layer, and, in addition, members disposed on the interlayer insulating layer, such as color filters and micro lenses, as required.

Although a method for manufacturing a CMOS image sensor has been described as the method for manufacturing a semiconductor apparatus, various modifications may be made without being limited to the above.

In the above embodiment, the first conductivity type impurity region 121, the first conductivity type second impurity region 122, and the first conductivity type well region 112 are formed in the second conductivity type silicon substrate 100. However, a second conductivity type storage region 113 may be formed in the silicon substrate 100, using a first conductivity type silicon substrate 100 as a first conductivity type well region 112. In this instance, the first impurity region 121 and the second impurity region 122 can have a conductivity of the first type, and the impurity concentration of the first impurity region 121 (and the second impurity region 122) can be higher than the impurity concentration of the silicon substrate 100 (well region) The formation of the well region 112 in Step <H> may be performed before the formation of the silicon nitride film 200.

In the above-describe embodiment, in Step <E>, the first ion implantation is performed from directions (X and Y directions), each perpendicular to the direction in which the corresponding portion of the bird's beak portion 310 extends, in the plane (X-Y plane) parallel to the main surface 1000 of the silicon substrate 100. However, the ion implantation may be performed from direction not perpendicular to the bird's beak portion 310. For example, the ion implantation may be performed from four directions: from a pint of $\phi=45°$ to a point of $\phi=225°$; from a pint of $\phi=225°$ to a point of $\phi=45°$; from a point of $\phi=135°$ to a point of $\phi=315°$, and form a point of $\phi=315°$ to a point of $\phi=135°$. In this instance, since the X direction component and the Y direction component overlap, the dose for one operation of the ion implantation can be reduced to approximately half. Accordingly, the time for the first ion implantation can be reduced relative to the case of the four directions in the above embodiment.

Also, the first impurity region 121 surrounding the element active portion can be formed by performing the first ion implantation from two directions: from a point of $\phi=45°$ to a point of $\phi=225°$; and from a point of $\phi=225°$ to a point of $\phi=45°$, for example. The number of directions of the ion implantation may be 8, 16 and so forth without being limited to 2 or 4. Alternatively, the ion implantation may be performed from directions continuously varied by rotating the silicon substrate 100 in the in-plane direction of the main surface 1000 (in the X-Y in-plane direction). The first impurity region 121 can be formed in any desired region, and does not necessarily surround the element active portion. Therefore, the first ion implantation may be performed from only one direction, depending on where the first impurity region 121 will be formed.

The implantation angle $\theta$ may be continuously varied in the range of $\beta \leq \theta \leq \alpha$, for example, by continuously slanting the X-Y plane of the silicon substrate 100. In the above embodiment, ion implantations performed in Step <E> and Step <G> use different masks (silicon nitride film 200 and first resist layer 210). However, Step <F> may be omitted so that the second ion implantation can be performed using the silicon nitride film 200 as a mask. The implantation angle $\theta$ may be continuously varied in the range of $\beta \leq \theta \leq \alpha$, for example, by continuously slanting the X-Y plane of the silicon substrate 100. The order of the first ion implantation and the second ion implantation may be reversed.

In steps subsequent to Step <F>, various modifications may be made. For example, the order of steps may be transposed, or one or some of the steps may be omitted. For example, the buffer film 430 formed in Step <G> may be replaced with a gate insulating film. The second resist layer 220 formed in Step <H> may be omitted, and the second portion 120 may be subjected to the third ion implantation. Thus, Step <I> can be omitted. The gate insulating film and/or the gate electrode of the transfer gate 600 may be formed after the first to sixth ion implantations.

However, it is desirable that the semiconductor elements that will be formed in the element active portions for the first semiconductor element group 1111 and the second semiconductor element group 2111 be formed after at least the first impurity regions 121 of the element isolation portions 3120 have been formed.

The second to sixth ion implantations may be performed by angled ion implantation if necessary. The first to sixth ion implantations, particularly the second and third ion implantations, may be performed a plurality of times under different conditions where at least the implantation energy or the dose is varied. Such operation can control the impurity concentration profile in the impurity regions formed by the respective ion implantations and, thus, enhance the performance of the resulting semiconductor apparatus.

The first to fourth resist layers are photosensitive resin (photoresist) films patterned by photolithography, but are not limited to such a film. For example, the first to fourth resist layers may be inorganic hard masks patterned by photolithography and etching.

The midportion 320 of the silicon oxide film 300 may be provided with an insulating member thereon as part of the element isolation portion 3120 after Step <E> and before Step <J>. As shown in FIGS. 1A and 1B, the gate electrodes of the transistors, including the gate electrode 601, can be formed so as to extend over the element isolation portion 3120. If the midportion 320 of the silicon oxide film 300 is relatively thin (having a thickness of less than 100 nm), the withstand voltage between the gate electrode and the second impurity region 122 is reduced. This increases the possibility of malfunction. Accordingly, an insulating member of silicon oxide or silicon nitride may be formed between the gate electrode and the midportion 320 to increase the withstand voltage between the gate electrode and the silicon substrate 100, particularly between the gate electrode and the second impurity region 122. This insulating member may be formed by depositing an insulating film of silicon oxide, silicon nitride or the like by CVD after removing the silicon nitride film 200, and then by patterning the insulating film so as to remain over the midportion 320. The method disclosed in Japanese Patent Laid-Open No. 2006-24876 may be applied to form this insulating member. More specifically, before removing the silicon nitride film 200, a silicon oxide film is deposited as an insulating film covering the silicon nitride film 200 and the midportion 320 by CVD or the like. This insulating film is embedded in the space in the silicon nitride film 200 (space over the midportion 320). Then, the insulating film is planarized to reduce the thickness by, for example, a CMP or etch back technique. After removing the substantially entire insulating film overlying the silicon nitride film 200, the silicon nitride film 200 is removed selectively to the insulating film. Thus, an insulating member having a pattern negative to the pattern of the silicon nitride film 200 is formed from the insulating film. As described above, if the insulating film and an insulating member are formed, the second ion implantation of Step <G> can be performed using the silicon nitride film 200 as a mask before forming the insulating film. The insulating film may have a double-layer structure, and the second ion implantation can be performed between the formations of the first and the second layer of the insulating film so that the width of the second impurity region 122 can be reduced. After removing the silicon nitride film 200 and forming an insulating member, the second ion implantation may be performed using the resist layer as a mask.

Although n embodiment using an image sensing apparatus has been described, examples of the semiconductor apparatus (photoelectric conversion apparatus) including a photoelectric conversion element 111 include photometric apparatuses, such as an auto exposure (AE) sensor, and distance measuring apparatuses, such as an autofocus (AF) sensor. Examples of the semiconductor apparatus of the invention include operational units, such as a MPU, and memory devices, such as flash memory and DRAM. Among semiconductor apparatuses, particularly in image sensing apparatuses, noise seriously affects the quality of taken images. Accordingly, image sensing apparatuses are required to reduce noise. It is therefore effective to apply the invention to methods for manufacturing image sensing apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-103007, filed May 2, 2011, which is hereby incorporated by reference herein in its entirety.

What is claimed is:

1. A method for manufacturing a semiconductor apparatus, comprising:
   the first step of thermally oxidizing a silicon substrate using as a mask a silicon nitride film disposed so as to cover a first portion of the silicon substrate without covering a second portion adjacent to the first portion, thus forming a silicon oxide film including a main portion on the second portion and a sub portion between the first portion and the silicon nitride film;
   the second step of forming a first conductivity type impurity region having a conductivity of a first type under the silicon oxide film; and
   the third step of forming a semiconductor element including a second conductivity type impurity region having a conductivity of a second type opposite to the first type, in the first portion after removing the silicon nitride film,
   wherein the second step includes performing angled ion implantation into a region under the sub portion using the silicon nitride film as a mask.

2. The method according to claim 1, wherein the angled ion implantation is performed at an implantation angle smaller than or equal to the angle of a line with the normal to the main surface of the silicon substrate, the line connecting the upper end of the sub portion and the upper origin of the sub portion, adjacent to the main portion.

3. The method according to claim 2, wherein the implantation angle is larger than or equal to the angle formed between the normal to the main surface and the normal, extending through the upper origin, to a line connecting the lower end of the sub portion and the lower origin of the sub portion, adjacent to the main portion.

4. The method according to claim 1, wherein the second portion surrounds the first portion, and the ion implantation is performed from at least two directions parallel to the main surface of the silicon substrate.

5. The method according to claim 1, wherein in the first step and the second step, a silicon oxide layer lies between the silicon substrate and the silicon nitride film, and a polysilicon layer lies between the silicon oxide layer and the silicon nitride film.

6. The method according to claim 1, wherein the angled ion implantation is performed at an implantation energy at which the first conductivity type impurity region comes into contact with the sub portion.

7. The method according to claim 1, wherein the angled ion implantation is performed so that the impurity concentration of the first conductivity type impurity region becomes the highest at the boundary between the silicon substrate and the silicon oxide film.

8. The method according to claim 1, wherein the angled ion implantation forms a first impurity region of the first conductivity type impurity region, and the second step further includes performing ion implantation into a region under the main portion to form a second impurity region of the first conductivity type impurity region.

9. The method according to claim 8, wherein the ion implantation for forming the second impurity region is performed using a resist layer as a mask, the resist layer being formed so as to cover the first portion after removing the silicon nitride film.

10. A method for manufacturing a CMOS image sensor, comprising using the method as set forth in claim 9.

11. The method according to claim 8, wherein the ion implantation for forming the second impurity region is performed using the silicon nitride film as a mask.

12. The method according to claim 8, wherein the second impurity region is formed at a position deeper than the first impurity region in the silicon substrate.

13. A method for manufacturing a CMOS image sensor, comprising using the method as set forth in claim 8, wherein a thickness of the main portion is 100 to 600 nm.

14. The method according to claim 1, further comprising the step of forming a first conductivity type third impurity region having a conductivity of the first type and having a lower impurity concentration than the first conductivity type impurity region formed in the second step, by performing ion implantation in the first portion before the first step or after the second step.

15. The method according to claim 1, wherein the third step includes forming a first conductivity type surface region having a conductivity of the first type between the second conductivity type impurity region and a surface of the silicon substrate that the first conductivity type surface region is adjacent to the first conductivity type impurity region.

16. The method according to claim 1, wherein the semiconductor element is a photoelectric conversion element, and the second conductivity type impurity region acts as a signal charge storage region.

17. A method for manufacturing a CMOS image sensor, comprising using the method as set forth in claim 16, wherein a thickness of the main portion is 100 to 600 nm.

18. A method for manufacturing a CMOS image sensor having an element isolation structure other than a shallow trench isolation structure, comprising using the method as set forth in claim 1.

19. A method for manufacturing a CMOS image sensor, comprising using the method as set forth in claim 5.

20. The method according to claim 1, wherein a thickness of the main portion is 100 to 600 nm.

* * * * *